US010360989B2

(12) United States Patent
Sreeramaneni et al.

(10) Patent No.: US 10,360,989 B2
(45) Date of Patent: Jul. 23, 2019

(54) ELECTRONIC DEVICE WITH A FUSE-READ TRIGGER MECHANISM

(71) Applicant: Micron Technology, Inc., Boise, ID (US)

(72) Inventors: Raghukiran Sreeramaneni, Frisco, TX (US); John E. Riley, McKinney, TX (US); Yu-Feng Chen, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/830,281

(22) Filed: Dec. 4, 2017

(65) Prior Publication Data

US 2019/0172546 A1    Jun. 6, 2019

(51) Int. Cl.
*G11C 17/18*    (2006.01)
*G11C 17/16*    (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16
USPC ........................................................... 365/96
See application file for complete search history.

(56) References Cited

U.S. PATENT DOCUMENTS

| 7,746,699 B1* | 6/2010 | Edwards | H03K 19/177 365/185.09 |
| 7,746,719 B2* | 6/2010 | Kang | G11C 7/20 365/225.7 |
| 7,826,296 B2* | 11/2010 | Kim | G11C 17/16 365/189.06 |
| 2006/0072364 A1* | 4/2006 | Yoshida | G11C 29/785 365/225.7 |
| 2010/0202183 A1* | 8/2010 | Kurjanowicz | G11C 17/16 365/94 |
| 2011/0035616 A1* | 2/2011 | Henry | G06F 11/10 714/2 |
| 2013/0322149 A1* | 12/2013 | Ryu | G11C 7/1045 365/96 |

* cited by examiner

*Primary Examiner* — Hoai V Ho
*Assistant Examiner* — Muna A Techane
(74) *Attorney, Agent, or Firm* — Perkins Coie LLP

(57) ABSTRACT

A method of operating an electronic device includes: generating a fuse read output based on reading a fuse cell at a predetermined data location in a fuse array, wherein the predetermined data location is configured to store predetermined data pattern; comparing the fuse read output to the predetermined data pattern; and generating a read-enable trigger based on the fuse read output matching the predetermined data pattern, wherein the read-enable trigger is for reading content stored in the fuse array and for broadcasting the content to circuits within the electronic device.

20 Claims, 4 Drawing Sheets

ELECTRONIC DEVICE WITH A FUSE-READ TRIGGER MECHANISM

TECHNICAL FIELD

The disclosed embodiments relate to electronic devices, and, in particular, to semiconductor devices with a fuse-read trigger mechanism.

BACKGROUND

Electronic devices, such as semiconductor devices, memory chips, microprocessor chips, and imager chips, can include a set of fuses for storing information. For example, the electronic devices, such as semiconductor dies, can include one or more fuse arrays (e.g., a set or a network of fuses or anti-fuses that are programmed to store information). The electronic devices can include the one or more fuse arrays in a particular location (e.g., a central location), thereby replacing discrete fuses that were located throughout the device in other designs. The semiconductor die can read the information (e.g., redundancy information, wafer lot number, die lot number, die position on the wafer, etc.) from the fuse array and transmit the information (e.g., based on communicating the information in a serial sequence), such as at device startup, initialization, or configuration.

However, conditions of the electronic devices can affect reliability of the fuse reading process. For example, a condition or a setting of the power supplies (e.g., an output thereof), such as during a stabilization period following device startup, initialization, or configuration, can cause erroneous fuse read. Any such read errors can cause persistent issues throughout the device's operation until the next startup, initialization, or configuration. Since fuse arrays can store all fuse information at a central location, the fuses have to be read and transmitted to other local destinations on the electronic devices (e.g., semiconductor chip) where the information is ultimately used. While attempts have been made to detect and prepare for proper fuse-reading conditions, various challenges (e.g., variable or inconsistent behavior or power supplies in real-time, difficulty in modeling real-time behavior or programmed settings of fuse cells, etc.) have made it difficult to ensure accurate and efficient fuse-reading operation. Thus, there is a need for a fuse-read trigger mechanism.

DETAILED DESCRIPTION

The technology disclosed herein relates to electronic devices (e.g., semiconductor-level devices, sets of analog circuitry components, etc.), systems with electronic devices, and related methods of operation or manufacture for the electronic devices in association with validating proper conditions for reading information programmed in fuse cells (e.g., anti-fuses).

The electronic devices can include fuse read circuits and condition validation circuit for reading or accessing information programmed or stored in the fuse cells. The fuse read circuits can be configured to read information stored in the fuse cells and the condition validation circuit can be configured to determine conditions satisfactory for reading the information stored in the fuse cells (e.g., satisfactory output level and/or stability of power supplies). The electronic devices can read and transmit the information stored in the fuse cells based on the condition validation circuit determining the satisfactory conditions.

The condition validation circuit can determine the satisfactory conditions when the fuse read circuit correctly reads known or predetermined information that is stored at a known or predetermined location within fuse array. The condition validation circuit can determine the conditions in real-time (e.g., after device power up, initialization, configuration, etc.) instead of a fixed time-out wait period or instead of using analog detection circuit to model the fuses as a linear resistor.

In some embodiments, the condition validation circuit can determine the satisfactory conditions when the fuse read circuit correctly reads the predetermined information for a threshold number of times (e.g., in sequence). In some embodiments, the condition validation circuit can determine the satisfactory conditions based on multiple known patterns at multiple different predetermined locations. In some embodiments, the condition validation circuit can determine the satisfactory conditions after a predetermined number of fuse reads/transmits. In some embodiments, the fuse array can include different known patterns across parallel fuses, which can be used to determine the satisfactory conditions.

Figure 1:
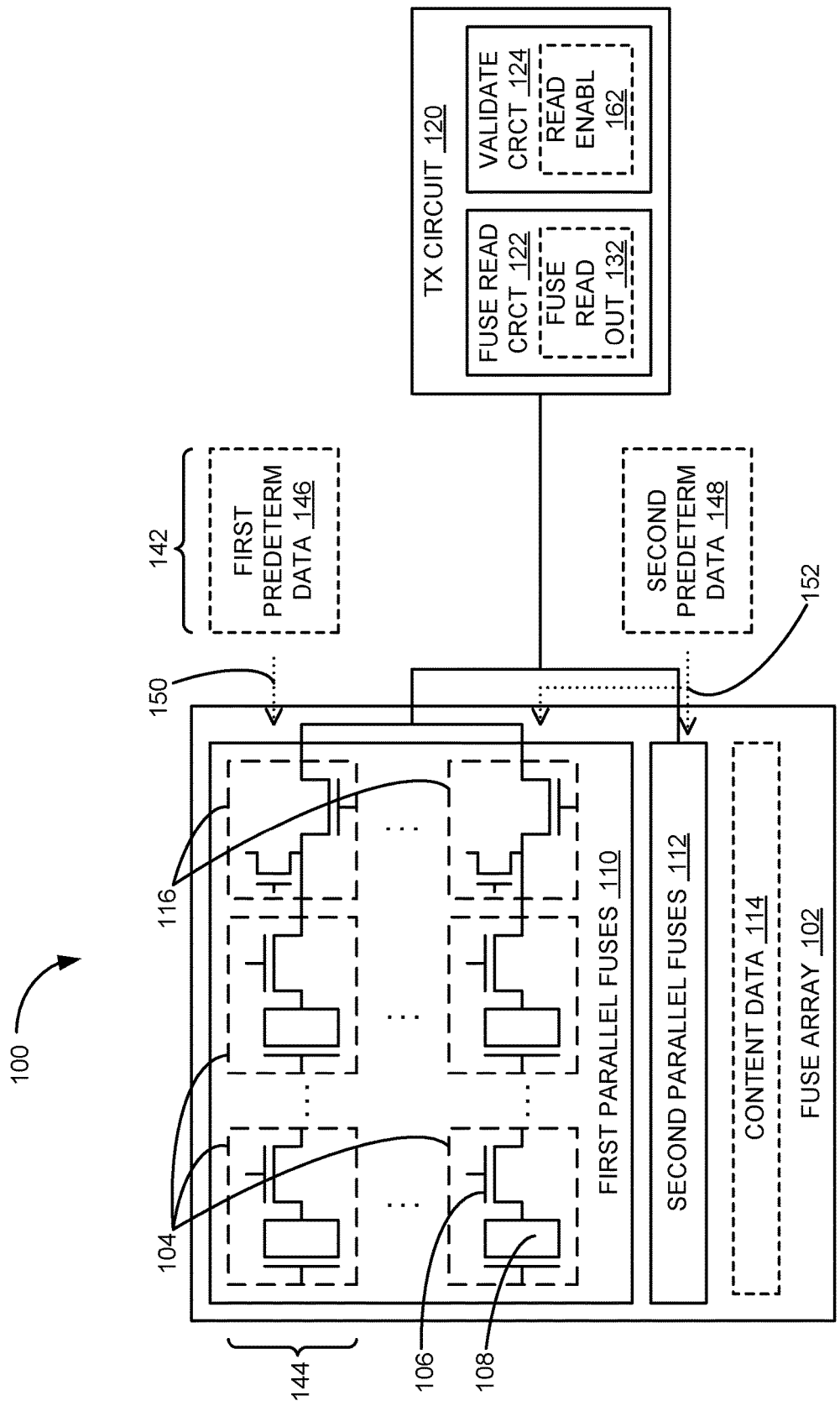
FIG. 1 is a circuit diagram of an electronic device with a fuse-read trigger mechanism in accordance with an embodiment of the present technology.

FIG. 1 is a circuit diagram of an electronic device 100 (e.g., a semiconductor die) with a fuse-read trigger mechanism in accordance with an embodiment of the present technology. The electronic device 100 can include one or more fuse arrays 102 that each include multiple fuse cells 104 configured to store information according to their programming settings (e.g., for blown or unblown fuse setting). In some embodiments, the fuse arrays 102 can be physically located at a specific portion of the electronic device 100 (e.g., at a central or dedicated portion within the die).

In some embodiments, the fuse cells 104 can each include a fuse transistor 106 and a setting circuit 108 (e.g., for anti-fuses or gate-oxide fuses). The fuse transistor 106 can be used to select the particular fuse cell for the reading operation (e.g., based on connecting to a reading circuit). The setting circuit 108 can include configurable circuitry (e.g. an oxide layer) that can be configured to represent information. For example, the fuse cells 104 can be anti-fuses or gate oxide fuses that provide a relatively high resistance (e.g., associated with an open circuit) when the cell is not programmed or unblown. When programmed or blown, the fuse cell can provide a relatively low resistance (e.g., as associated with an electrical short) to ground or lower potential node, such as through a weakened or damaged oxide layer.

In some embodiments, the fuse array 102 can include parallel fuse sets that can be programmed to provide redundant or backup data and/or for reading the data in parallel. For example, the fuse array 102 can include at least first parallel fuses 110 and second parallel fuses 112. The first parallel fuses 110 and the second parallel fuses 112 can be programmed with same or redundant settings/patterns for representing content data 114 (e.g., redundancy information, wafer lot number, die lot number, die position on wafer, etc.) that can be used throughout the electronic device 100 (e.g., by circuits other than the fuse array 102). The electronic device 100 can read the information stored in the first parallel fuses 110 simultaneously with or in parallel to the information stored in the second parallel fuses 112 (e.g., using multiple reading circuits) for accuracy.

The electronic device 100 can store the content data 114 in the fuse array 102 based on the fuse settings (e.g., as a form of persistent or non-volatile storage) for use at one or more designated instances (e.g., at device power-up, initialization, configuration, etc.). At the designated instances, the electronic device 100 can use a fuse selection circuit 116 (e.g., a set of switches) to access (e.g., based on connecting a reading and/or broadcasting circuit thereto) one or more targeted fuse cells. The fuse selection circuit 116 can connect the targeted fuse cell to a broadcasting circuit 120 or a component therein (e.g., a fuse read circuit 122, a condition validation circuit 124, etc.).

The transmitting circuit 120 can include circuitry configured to validate a target condition (e.g., power source setting, power levels, power reliability, read accuracy, etc.) for reading the content data 114, read the data stored in one or more fuses, broadcast the read information to other circuits in the electronic device (e.g., other portions of the die), or a combination thereof. In some embodiments, the broadcasting circuit 120 or one or more portions therein can be implemented as a state machine.

The fuse read circuit 122 can be configured to generate a fuse read output 132 based on reading the information stored in the connected fuse. For example, the fuse read circuit 122 can read the information based on providing a voltage level through the connected fuse. The provided voltage level can be pulled up/maintained (e.g., for unblown fuses) or pulled down (e.g., for blown fuses) due to the resistance corresponding to the setting of the connected fuse (e.g., a relatively high resistance corresponding to an open circuit for unblown fuses and a relatively low resistance to ground or a lower potential node for blown fuses). The fuse read circuit 122 can read the information or determine the fuse setting according to the change in the voltage level due to the programmed setting. Accordingly, the fuse read circuit 122 can generate the fuse read output 132 as data (e.g., one or more binary bits) corresponding to the determined settings of the read fuse cells.

The condition validation circuit 124 (e.g., a portion of broadcasting state machine) can be configured to validate the target condition for reading and broadcasting the content data 114. The condition validation circuit 124 can validate the target condition that corresponds to conditions for producing accurate fuse reading results (e.g., based on a targeted power level and/or stability of power supplies).

The condition validation circuit 124 can validate based on verifying correct or accurate reads of one or more predetermined data patterns 142 that are stored at one or more predetermined data locations 144. The fuse array 102 can be preprogrammed (e.g., at PROBE test stage or after the semiconductor wafer finishes fabrication) to include the one or more predetermined data patterns 142 (e.g., a first predetermined data 146, a second predetermined data 148, etc.) at the one or more predetermined data locations 144 (e.g., a first location 150, a second location 152, etc.). In some embodiments, the fuse array 102 can be preprogrammed with the first predetermined data 146 at multiple locations (e.g., the first location 150, the second location 152, etc.) within the fuse array 102. In some embodiments, the fuse array 102 can be preprogrammed with different verification data, such as based on preprogramming the first predetermined data 146 at the first location 150 and the second predetermined data 148 at the second location 152 within the fuse array 102. In some embodiments the fuse array 102 can preprogram the predetermined data patterns 142 across the parallel fuses. The first predetermined data 146 can be preprogrammed at or stored in the first location 150 corresponding to or within the first parallel fuses 110. The second predetermined data 148 can be preprogrammed at or stored in the second location 152 corresponding to or within the second parallel fuses 112.

To validate the target condition, the broadcasting circuit 120 can access (e.g., at the designated instances discussed above) the predetermined data locations 144 (e.g., the first location 150, the second location 152, etc.) to generate the fuse read output 132. The broadcasting circuit 120 can validate the target condition when the resulting fuse read output 132 matches the predetermined data patterns 142.

The broadcasting circuit 120 can generate a read-enable trigger 162 (e.g., a signal or a flag) based on validating the target condition, such as when the resulting fuse read output 132 matches the predetermined data patterns 142. The broadcasting circuit 120 can generate the read-enable trigger 162 to initiate a process for reading and broadcasting of the content data 114.

In some embodiments, the broadcasting circuit 120 can generate the read-enable trigger 162 based on accurately reading from the predetermined data locations 144 for a threshold number of times. The broadcasting circuit 120 can iteratively generate the fuse read output 132 based on reading one or more of the predetermined data locations 144 and increment a count when the fuse read output 132 matches corresponding instance of the predetermined data patterns 142. The broadcasting circuit 120 can generate the read-enable trigger 162 when the count reaches a triggering condition (e.g., a minimum requirement for successful reads).

In some embodiments, the broadcasting circuit 120 can generate the read-enable trigger 162 based on accurately reading from the predetermined data locations 144 for a threshold consecutive number of reads. The broadcasting circuit 120 can iteratively generate the fuse read output 132 and increment the count as discussed above. To require a minimum number of consecutive accurate reads, the broadcasting circuit 120 can additionally reset the count when the fuse read output 132 does not match corresponding instance of the predetermined data patterns 142.

In some embodiments, the broadcasting circuit 120 can generate the read-enable trigger 162 based on accurately reading from multiple locations according to a predetermined pattern. For example, the broadcasting circuit 120 can generate the read-enable trigger 162 based on accurately reading the same data from a sequence of locations (e.g., the first location 150, the second location 152, etc.). Also for example, the broadcasting circuit 120 can generate the read-enable trigger 162 based on accurately reading a pattern of data (e.g., the first predetermined data 146, the second predetermined data 148, etc.) from a sequence of locations, such as for alternating between the location/data or for successfully reading the first predetermined data 146 for a threshold number of times and then also successfully reading the second predetermined data 148 for a threshold number of times. In some embodiments, the different predetermined locations can be across parallel circuits as discussed above.

In some embodiments, the broadcasting circuit 120 can repeat the validation process after reading/broadcasting the content data 114 for a threshold number of times. The broadcasting circuit 120 can proceed to reading and broadcasting the content data 114 based on initially validating the target conditions as discussed above. The broadcasting circuit 120 can increment a broadcasting count each time the content data 114 is accessed, read, and broadcasted to other circuits. When the broadcasting count reaches a threshold, the broadcasting circuit 120 can repeat the validating process discussed above (e.g., reading from the predetermined data locations 144, comparing the resulting fuse read output, and iterating until the fuse read output 132 matches the corresponding predetermined data and satisfies a condition). Based on repeating the validation process, the broadcasting circuit 120 can make sure that the target condition remains.

Figure 2:
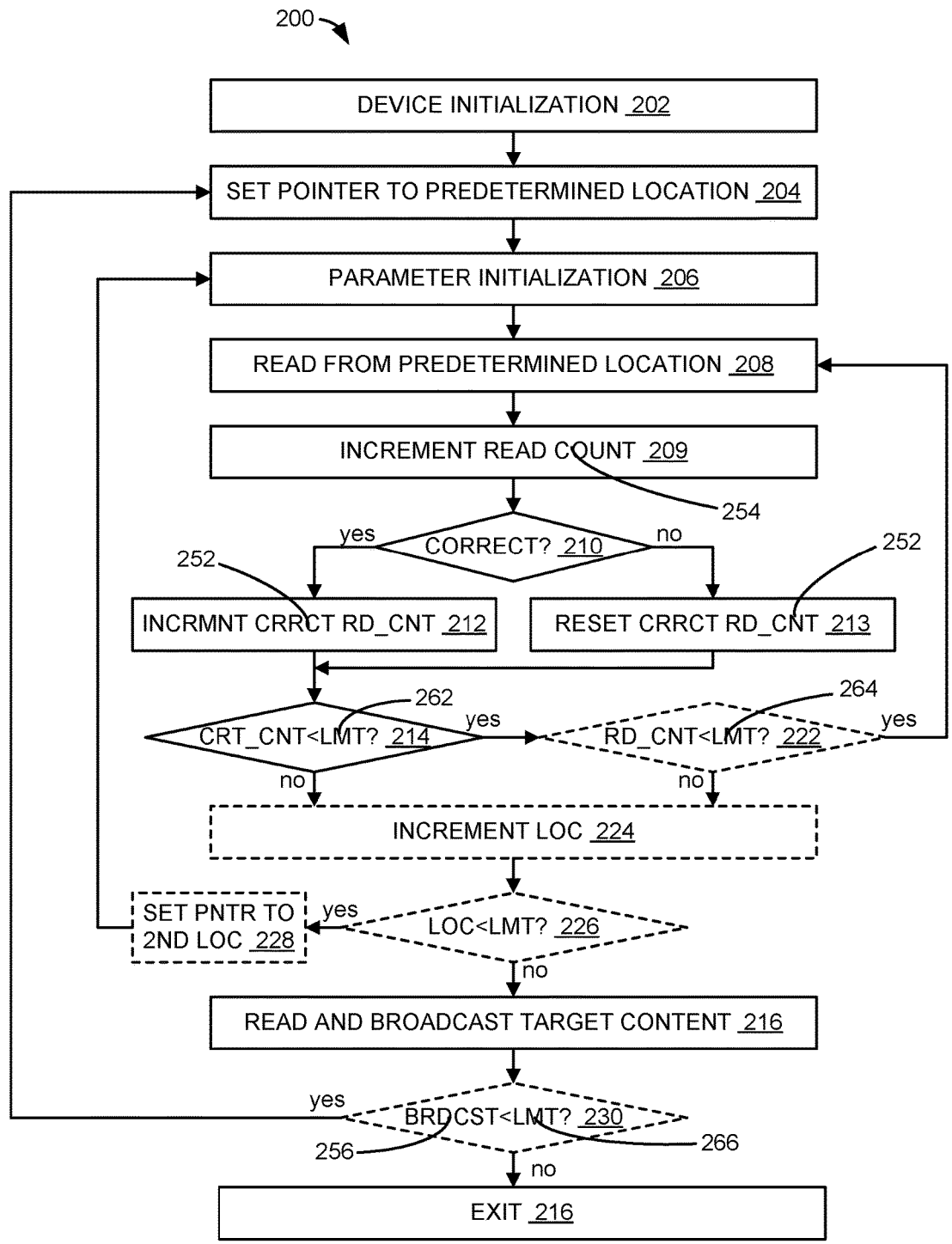
FIG. 2 illustrates an example method of operating an electronic system in accordance with embodiments of the present technology.

FIG. 2 illustrates an example method 200 of operating an electronic system in accordance with embodiments of the present technology. The method 200 can be for operating the electronic device 100 of FIG. 1, such as by validating target conditions for reading the content data 114 of FIG. 1. The method 200 can validate based on verifying accurate reads of one or more of the predetermined data patterns 142 of FIG. 1 from one or more of the predetermined data locations 144 of FIG. 1.

At block 202, the method 200 can begin based on initialization of the electronic device 100. For example, the method 200 can be for validating the conditions to read and broadcast the content data 114 after initiating the electronic device 100, powering up the electronic device 100, configuring the electronic device 100, or a combination thereof.

At block 204, the electronic device 100 (e.g., using the broadcasting circuit 120 of FIG. 1, a component therein, a control circuit, or a combination thereof) can set a read pointer to a predetermined location. For example, the electronic device 100 can set the read pointer to one of the predetermined data locations 144 of FIG. 1 (e.g., the first location 150 of FIG. 1) for reading the corresponding instance of the predetermined data pattern (e.g., the first predetermined data 146).

At block 206, the electronic device 100 can initialize or reset parameters used to implement the method 200. For example, the electronic device 100 can initialize and/or reset various counts (e.g., a correct-read count 252, a total read count 254, a broadcasting count 256, etc.), flags (e.g., the read-enable trigger 162 of FIG. 1), etc. Also for example, the electronic device 100 can access and/or load various limits, thresholds, or ranges, such as a triggering condition 262, a total read limit 264, a broadcasting threshold 266, etc.

At block 208, the electronic device 100 (e.g., using the fuse read circuit 122 of FIG. 1) can read from the predetermined location. The electronic device 100 can generate the fuse read output 132 of FIG. 1 based on reading the fuse cells 104 of FIG. 1 corresponding to the read pointer (e.g., based on reading from the first location 150 corresponding to block 204 or other locations, such as the second location 152 of FIG. 1 corresponding to validation patterns/conditions, in the fuse array 102 of FIG. 1).

At block 209, the electronic device 100 can increment the total read count 254 each time predetermined data location is accessed to generate the fuse read output. The electronic device 100 can increment the total read count 254 for limiting a total number of reads to ensure the validation process can end.

At block 210, the electronic device 100 can check to see if the reading result is correct. The electronic device 100 (e.g., using the fuse read circuit 122, the condition validation circuit 124 of FIG. 1, the control circuit, etc.) can compare the fuse read output 132 to the corresponding predetermined data patterns 142. For example, the electronic device 100 can compare the fuse read output 132 to the first predetermined data 146 when the output is generated from reading the first location 150. Also for example, the electronic device 100 can compare the fuse read output 132 to the second predetermined data 148 when the output is generated from reading the second location 152.

At block 212, the electronic device 100 can increment the correct-read count 252 when the fuse read output 132 matches the predetermined data pattern (e.g., the read returned correct results corresponding to desirable reading conditions). In some embodiments, at block 213, the electronic device 100 can reset the correct read count 252 when the fuse read output 132 does not match the predetermined data pattern (e.g., the read returned incorrect results due to undesirable reading conditions). The electronic device 100 can generate the read-enable trigger 162 based on the correct-read count 252 satisfying the triggering condition 262, such as for representing a minimum number of correct reads or a minimum number of correct consecutive reads. Based on resetting the correct-read count 252, the electronic device 100 can require the minimum number of correct consecutive reads.

When the correct-read count 252 does not satisfy the triggering condition 262 (e.g., the electronic device 100 cannot verify that the reading conditions have stabilized to the target conditions), the electronic device 100 can repeat the read from the predetermined location (e.g., feedback loop to block 208 for iterative reads). The electronic device 100 can iteratively generate the fuse read output 132 based on reading the predetermined location until the correct-read count 252 satisfies the triggering condition 262.

At block 214 (e.g., after processing the correct-read count 252), the electronic device 100 (using the fuse read circuit 122, the condition validation circuit 124 of FIG. 1, the control circuit, etc.) can compare the correct-read count 252 to the triggering condition 262 for generating the read-enable trigger 162. In some embodiments, such as at block 222, the electronic device 100 can compare the total read count 254 to the total read limit 264 when the correct-read count 252 is still below the triggering condition 262. When/while the total read count 254 is below the total read limit 264, the flow can pass to block 208, and accordingly, the electronic device 100 can iteratively read from the predetermined location to validate the reading conditions.

In some embodiments the electronic device 100 can validate the target reading conditions using a set or a pattern of locations and/or data. At block 224, the electronic device 100 can increment a location counter when the correct-read count 252 does not exceed or reach the triggering condition 262 and/or when the total read count 254 does not exceed or reach the total read limit 264. At block 226, the electronic device 100 can compare the location counter to a limit for the corresponding counter. At block 228, the electronic device 100 (e.g., using the broadcasting circuit 120, a component therein, a control circuit, or a combination thereof) can set the read pointer to a second predetermined location. For example, the electronic device 100 can set the read pointer to a different instance of the predetermined data locations 144 (e.g., the second location 152 according to the set or the pattern).

According to the embodiment, the control flow can pass back to block 206 and the electronic device 100 can read from the updated location for continuing condition validation. The electronic device 100 can repeat the validation process based on reading form the different data location (e.g., based on repeating processes described above for blocks 206, 208, 209, 210, 212, 213, 214, 222, 224, 226, 228, or a combination thereof). For example, the electronic device 100 can generate the fuse read output 132 (e.g., a second output) based on reading from the second location 152 after the fuse read output 132 (e.g., a first output) of reading from the first location 150 matches the predetermined data pattern. In some embodiments, the second location 152 can be configured to represent the same predetermined data pattern (e.g., the first predetermined data 146 at both locations). In some embodiments, the second location 152 can be configured to represent a different data (e.g., the second predetermined data 148 that is different from the first predetermined data 146 stored at the first location 150). In some embodiments, the electronic device 100 can read across parallel fuses to validate the target condition. For example, the first location 150 can correspond to the first parallel fuses 110 of FIG. 1 and the second location 152 can correspond to the second parallel fuses 112 of FIG. 1.

The electronic device 100 can validate the target condition based on a pattern or sequence of locations and/or predetermine data based on iteratively looping through the processes discussed above (e.g., for blocks 206, 208, 209, 210, 212, 213, 214, 222, 224, 226, 228, or a combination thereof). For example, the electronic device 100 can initially validate using data stored in the first location 150, and based on successful read thereof, validate using data stored in the second location 152. Also for example, the electronic device 100 can validate based on alternating between the first location 150 and the second location 152 (e.g., alternating across iterations, alternating after meeting an initial condition, etc.). Also for example, the electronic device 100 can validate based on performing parallel or combined read (read 'A'+read 'B') for both the first location 150 and the second location 152 (e.g., for parallel fuses).

At block 216 (e.g., directly following block 214 or block 226), the electronic device 100 (e.g., using the broadcasting circuit 120) can read and broadcast the content data 114 following accurate read from one or more predetermined locations. The electronic device 100 can generate the read-enable trigger 162 based on confirming one or more accurate reads from the predetermined data locations 144. For example, the electronic device 100 can generate the read-enable trigger 162 based on the fuse read output 132 (e.g., the first output, the second output, etc.) matches the predetermined data patterns 142 (e.g., the first predetermined data 146, the second predetermined data 148, etc.) according to the validation pattern, set, sequence, or process.

The electronic device 100 can generate the read-enable trigger 162 for representing a validation of the target condition associated with reading and broadcasting the content data 114. Based on the read-enable trigger 162, the electronic device 100 can read the content data 114 stored in the fuse array 102 (e.g., outside of the predetermined data locations 144) and broadcast the content data 114 to other circuits within the electronic device 100. The electronic device 100 (e.g., using the fuse read circuit 122) can read the content data 114 based on the read-enable trigger 162 and transmit the content data 114 to one or more circuits within the electronic device 100 and outside of the fuse array 102.

In some embodiments, the electronic device 100 can continually and/or periodically verify the target condition. For example, the electronic device 100 can increment the broadcasting count 256 for each read and/or transmission of the content data 114 (e.g., as part of block 216). At block 230, the electronic device 100 can compare the broadcasting count 256 to the broadcasting threshold 266. When the broadcasting count 256 meets or exceeds the broadcasting threshold 266, the method 200 can end.

When the broadcasting count 256 is less than the broadcasting threshold 266, the electronic device 100 can revalidate the reading conditions. For example, the electronic device 100 can reset the read-enable trigger 162 when the broadcasting count 256 reaches the broadcasting threshold 266. When the read-enable trigger 162 is reset or disabled, the control flow can pass to block 204 and repeat the processes discussed above. For example, the electronic device 100 can re-generating the fuse read output 132 based on reading the predetermined data locations 144. The electronic device 100 can further re-generating the read-enable trigger 162 based on the fuse read output 132 matching the predetermined data patterns as discussed above (e.g., for re-validating the target condition).

Iteratively reading one or more predetermined data patterns from one or more predetermined locations (e.g., to generate the fuse read output 132) and comparing it to the intended predetermined data patterns provides real-time validation of the target condition. Inaccurate reads from the fuse array 102 can provide persistent errors throughout the electronic device 100 since the broadcasted information is stored and utilized by the circuits until a power-cycle. As such, validating the target condition (e.g., stable power supply levels) decreases the errors.

Further, the real-time read verifications can further decrease the amount of time needed for the target condition validation and/or reduce any errors associated thereto. The real-time read verification can reduce the error risk associated with using linear modeling of fuses (e.g., based on non-linear behavior of fuses) to validate or ensure the target read condition. The real-time read verification can further reduce a fixed time-out or wait period, thereby decreasing the validation time and/or accounting for potentially insufficiency of the fixed time-out or wait period.

Figure 3:
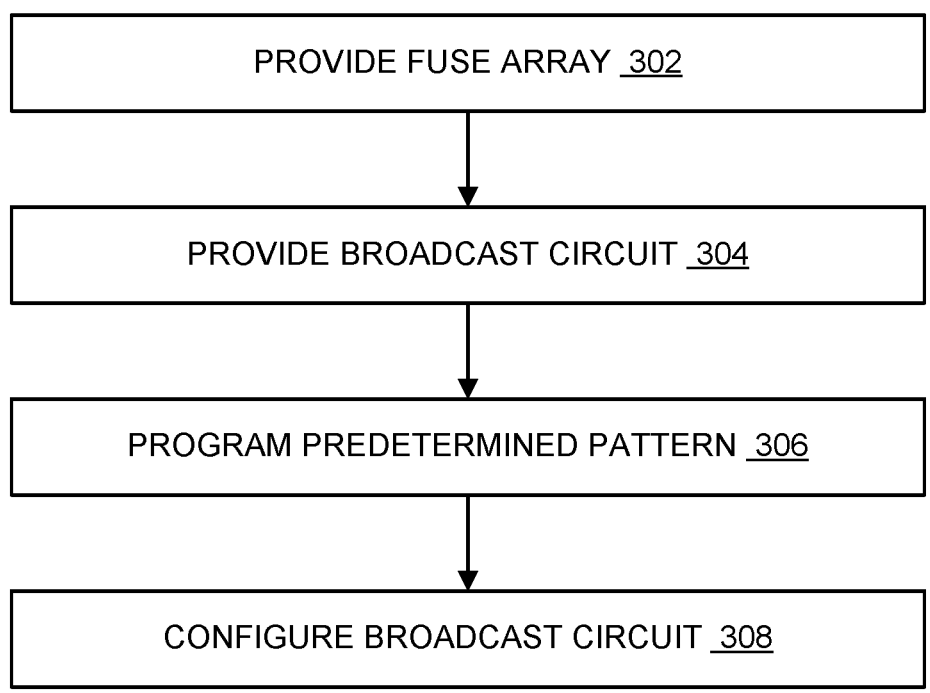
FIG. 3 illustrates an example method of manufacturing an electronic device in accordance with embodiments of the present technology.

FIG. 3 illustrates an example method 300 of manufacturing an electronic device in accordance with embodiments of the present technology. The method 300 can be for manufacturing the electronic device 100 of FIG. 1.

At block 302, the fuse array 102 of FIG. 1 can be provided. In some embodiments, providing the fuse array 102 can include forming the integrated circuitry in semiconductor layers (e.g., during formation of the semiconductor die). In some embodiments, providing the fuse array 102 can include assembling or connecting circuit components. The fuse array 102 can be physically located at a particular or central portion of the electronic device 100.

The fuse array 102 can be provided with multiple instances of the fuse cells 104 of FIG. 1 therein. The fuse cells 104 can be configured to store information based on their programmed settings. In some embodiments, the fuse array 102 can include anti-fuses (e.g., gate oxide fuses) that each includes the fuse transistor 106 of FIG. 1 and the setting circuit 108 of FIG. 1. The anti-fuses can be set or programmed (e.g., for blown fuses) to provide a first resistance level (e.g., a relative low resistance targeting an electrical short to a ground or a lower potential node), such as by damaging the setting circuit 108 (e.g., an electrical insulator, such as the oxide layer). The anti-fuses can be unprogrammed to provide a second resistance level (e.g., a relative high resistance targeting an electrical open) that is higher than the first resistance level (e.g., greater by one or more orders of magnitude, such as by a factor of 1,000 or more).

At block 304, the broadcasting circuit 120 of FIG. 1 (e.g., including the fuse read circuit 122 of FIG. 1, the condition validation circuit 124 of FIG. 1, etc.) can be provided. In some embodiments, providing the broadcasting circuit 120 can include forming the integrated circuitry in the semiconductor layers (e.g., during formation of the semiconductor die). In some embodiments, providing the broadcasting circuit 120 can include assembling or connecting circuit components. In some embodiments, providing the broadcasting circuit 120 can include connecting the broadcasting circuit 120 or a sub-circuit therein to the fuse array 102 (e.g., to the fuse selection circuit 116 of FIG. 1).

At block 306, the fuse array 102 can be preprogrammed with the predetermined data patterns 142 of FIG. 1 at the predetermined data locations 144 of FIG. 1. The fuse cells corresponding to the predetermined data locations 144 can be programmed (e.g., based on programming the fuses to blown or unblown settings) to match the predetermined data patterns 142. For example, the fuses can be preprogrammed at probe test step after the wafer for the electronic device 100 comes out of fabrication. The fuses can be preprogrammed at first order of testing.

At block 308, the broadcasting circuit 120 can be configured. For example, the broadcasting circuit 120 can be configured with the predetermined data locations 144 and the predetermined data patterns 142. Also for example, the broadcasting circuit 120 can be configured to implement the method 200 of FIG. 2 or a portion thereof.

Figure 4:
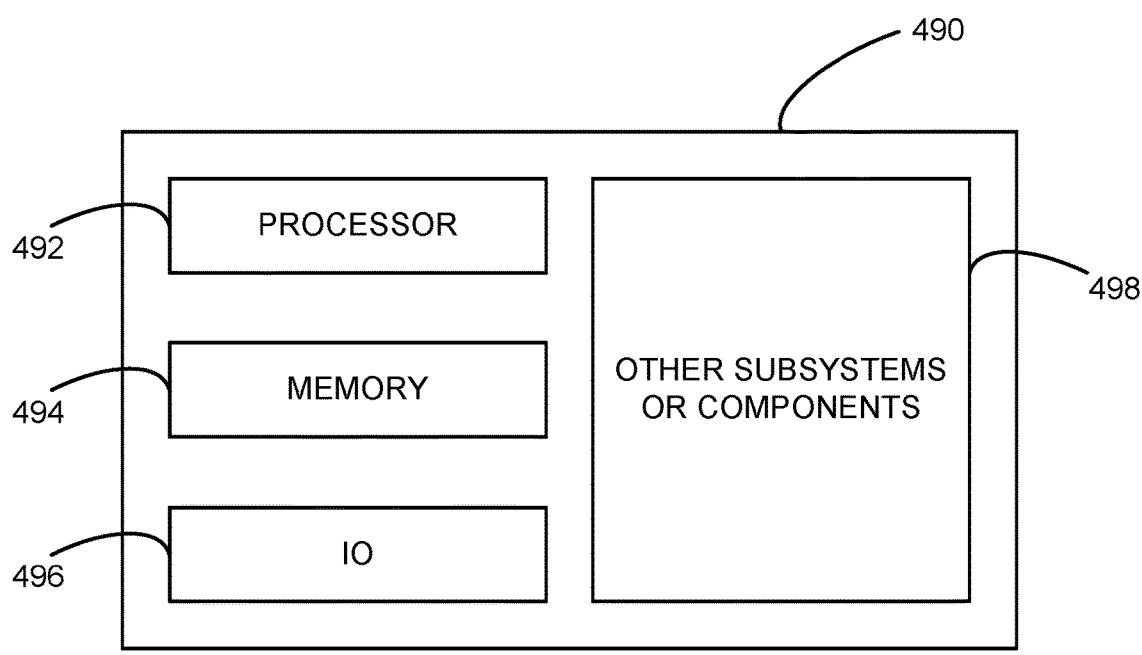
FIG. 4 is a schematic view of a system that includes an electronic device in accordance with embodiments of the present technology.

FIG. 4 is a schematic view of a system that includes an electronic device in accordance with embodiments of the present technology. Any one of the semiconductor devices having the features described above with reference to FIGS. 1-3 can be incorporated into any of a myriad of larger and/or more complex systems, a representative example of which is system 490 shown schematically in FIG. 4. The system 490 can include a processor 492, a memory 494 (e.g., SRAM, DRAM, flash, and/or other memory devices), input/output devices 496, and/or other subsystems or components 498. The semiconductor assemblies, devices, and device packages described above with reference to FIGS. 1-3 can be included in any of the elements shown in FIG. 4. The resulting system 490 can be configured to perform any of a wide variety of suitable computing, processing, storage, sensing, imaging, and/or other functions. Accordingly, representative examples of the system 490 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 490 include lights, cameras, vehicles, etc. With regard to these and other examples, the system 490 can be housed in a single unit or distributed over multiple interconnected units, e.g., through a communication network. The components of the system 490 can accordingly include local and/or remote memory storage devices and any of a wide variety of suitable computer-readable media.

From the foregoing, it will be appreciated that specific embodiments of the present technology have been described herein for purposes of illustration, but that various modifications may be made without deviating from the disclosure. In addition, certain aspects of the disclosure described in the context of particular embodiments may be combined or eliminated in other embodiments. Further, while advantages associated with certain embodiments have been described in the context of those embodiments, other embodiments may also exhibit such advantages. Not all embodiments need necessarily exhibit such advantages to fall within the scope of the present disclosure. Accordingly, the disclosure and associated technology can encompass other embodiments not expressly shown or described herein.

We claim:

1. A method of operating an electronic device, comprising:
    iteratively generating a fuse read output based on reading a fuse cell at a predetermined data location in a fuse array, wherein the predetermined data location is configured to store a predetermined data pattern;
    comparing the fuse read output to the predetermined data pattern;
    detecting a proper fuse-reading condition when the fuse read output matches the predetermined data pattern, wherein the proper fuse-reading condition is for representing a condition of a fuse read circuit that reduces errors in reading content stored in the fuse array; and
    generating a read-enable trigger when the proper fuse-reading condition is detected, wherein the read-enable trigger is for initiating reading of the content stored in the fuse array and for communicating the content to circuits within the electronic device.

2. The method of claim 1, further comprising:
    incrementing a correct-read count when the fuse read output matches the predetermined data pattern;
    wherein:
    generating the read-enable trigger includes generating the read-enable trigger when the correct-read count satisfies a triggering condition; and
    generating the fuse read output includes iteratively generating the fuse read output until the correct-read count satisfies the triggering condition.

3. The method of claim 2, further comprising resetting the correct-read count when the fuse read output does not match the predetermined data pattern for generating the read-enable trigger based on the triggering condition requiring matching the fuse read output to the predetermined data pattern for a threshold number of consecutive reads from the predetermined data location.

4. The method of claim 1, wherein:
    generating the fuse read output includes iteratively generating the fuse read output according to a triggering condition;
    further comprising:
    incrementing a total read count each time the predetermined data location is accessed to generate the fuse read output; and
    limiting the iterative generation of the fuse read output from the predetermined data location based on the total read count.

5. The method of claim 1, further comprising:
    generating a second output based on reading from a second location; and
    wherein:
    generating the read-enable trigger includes generating the read-enable trigger based the fuse read output and the second output matching the predetermined data pattern.

6. The method of claim 1, further comprising:
    generating a second output based on reading from a second location configured to store a second predetermined data; and
    wherein:
    generating the read-enable trigger includes generating the read-enable trigger based the fuse read output matching the predetermined data pattern and the second output matching the second predetermined data.

7. The method of claim 6, wherein generating the second output includes generating the second output when the fuse read output matches the predetermined data pattern.

8. The method of claim 6, wherein:
generating the fuse read output includes generating the fuse read output based on reading from the predetermined data location corresponding to first parallel fuses of the fuse array;
generating the second output includes generating the second output based on reading from the second location corresponding to second parallel fuses of the fuse array,
wherein the first parallel fuses and the second parallel fuses are configured to provide redundant information for locations outside of the predetermined data location and the second location.

9. The method of claim 1, wherein:
generating the fuse read output includes generating the fuse read output from the predetermined data location after initiating the electronic device, powering up the electronic device, configuring the electronic device, or a combination thereof; and
the read-enable trigger is for representing a target condition for reading and broadcasting the content.

10. A method of operating an apparatus, further comprising:
generating a fuse read output based on reading a fuse cell at a predetermined data location in a fuse array, wherein the predetermined data location is configured to store a predetermined data pattern;
comparing the fuse read output to the predetermined data pattern;
generating a read-enable trigger based on the fuse read output matching the predetermined data pattern, wherein the read-enable trigger is for reading content stored in the fuse array and for communicating the content to circuits within the electronic device
incrementing a broadcasting count for each read and transmission of the content;
resetting the read-enable trigger when the broadcasting count reaches a broadcasting threshold;
re-generating the fuse read output based on reading the predetermined data location when the read-enable trigger is reset; and
re-generating the read-enable trigger based on the fuse read output matching the predetermined data pattern for re-validating a target condition for reading and broadcasting the content.

11. An electronic device, comprising:
a fuse array including fuse cells configured to store information, the fuse array configured to store a predetermined data pattern at a predetermined data location therein and content information outside of the predetermined data location;
a fuse read circuit connected to the fuse array, the fuse read circuit configured to iteratively generate a fuse read output based on reading from the predetermined data location for evaluating a fuse-reading condition; and
a condition validation circuit electrically coupled to the fuse read circuit, the condition validation circuit configured to generate a read-enable trigger based on detecting a proper fuse-reading condition, wherein:
the proper fuse-reading condition is for representing a condition of the fuse read circuit that reduces errors in reading content stored in the fuse array,
the proper fuse-reading condition is detected when the fuse read output matches the predetermined data pattern, and
the read-enable trigger is for initiating reading of the content stored in the fuse array and for communicating the content to circuits within the electronic device.

12. The electronic device of claim 11, wherein the condition validation circuit comprises a state machine.

13. The electronic device of claim 11, further comprising a transmitting circuit electrically coupled to the fuse array, wherein the transmitting circuit includes the fuse read circuit and the condition validation circuit, the transmitting circuit configured to read the content and transmit the content to one or more circuits within the electronic device after validating the proper fuse-reading condition corresponding to the fuse read output matching the predetermined data pattern.

14. The electronic device of claim 13, wherein the transmitting circuit is configured to iteratively read the predetermined data location and compare the fuse read output and the predetermined data pattern until the target condition is verified.

15. The electronic device of claim 11, wherein:
the fuse array is configured to store a second predetermined data at a second location, wherein the second predetermined data is excluded from the content;
the fuse read circuit is configured to read from the second location; and
the condition validation circuit is configured to generate the read-enable trigger based the based the fuse read output matching the predetermined data pattern and the second output matching the second predetermined data.

16. The electronic device of claim 15, wherein the fuse read circuit is configured to read from the second location when the fuse read output matches the predetermined data pattern.

17. The electronic device of claim 15, wherein the fuse array includes first parallel fuses and second parallel fuses configured to provide redundancy for the content, wherein the predetermined data location corresponds to the first parallel fuses and the second location corresponds to the second parallel fuses.

18. The electronic device of claim 11, wherein the fuse array includes anti-fuses each including an oxide layer configurable in unblown setting or a blown setting, wherein the unblown setting corresponds to a first resistance level associated with an electrical open during a read operation for representing a data value and the blown setting corresponds to a second resistance level associated with an electrical short during the read operation for representing a different data value, the second resistance level lower than the first resistance level.

19. The electronic device of claim 18, wherein the anti-fuses are located at a designated physical portion of the electronic device.

20. The electronic device of claim 19, wherein the electronic device is a semiconductor die.

* * * * *